(12) United States Patent
Kurokawa et al.

(10) Patent No.: US 7,766,021 B2
(45) Date of Patent: Aug. 3, 2010

(54) SUBSTRATE TREATMENT APPARATUS

(75) Inventors: Yoshiaki Kurokawa, Kanagawa (JP); Koichi Higuchi, Kanagawa (JP)

(73) Assignee: Shibaura Mechatronics Corporation, Kanagawa (JP)

( * ) Notice: Subject to any disclaimer, the term of this patent is extended or adjusted under 35 U.S.C. 154(b) by 347 days.

(21) Appl. No.: 11/816,648

(22) Filed: Aug. 20, 2007

(65) Prior Publication Data
US 2009/0071511 A1 Mar. 19, 2009

Related U.S. Application Data

(63) Continuation of application No. PCT/JP2006/323996, filed on Nov. 30, 2006.

(30) Foreign Application Priority Data
Nov. 30, 2005 (JP) ............................. 2005-345580

(51) Int. Cl.
*B08B 3/10* (2006.01)
(52) U.S. Cl. .................. 134/157; 134/186; 134/902
(58) Field of Classification Search .............. 134/157, 134/186, 902
See application file for complete search history.

(56) References Cited
U.S. PATENT DOCUMENTS 5,540,245 A * 7/1996 Munakata et al. ............. 134/76
5,678,116 A * 10/1997 Sugimoto et al. ............ 396/611
5,990,060 A * 11/1999 Ohmi et al. .................. 510/175
6,090,205 A * 7/2000 Sakai et al. .................. 118/500
6,230,722 B1 * 5/2001 Mitsumori et al. ...... 134/122 R
6,431,184 B1 * 8/2002 Taniyama .................... 134/1.3
6,791,242 B2 * 9/2004 Beck et al. ................... 310/367

FOREIGN PATENT DOCUMENTS

| JP | 07-066164 | * | 3/1995 |
| JP | 08-078368 | * | 1/1996 |
| JP | 2005-131602 | * | 5/2001 |

OTHER PUBLICATIONS

English translation of the International Preliminary Report on Patentability which issued in the parent International Application No. PCT/JP2006/323996.

* cited by examiner

*Primary Examiner*—Frankie L Stinson
(74) *Attorney, Agent, or Firm*—Volpe and Koenig, P.C.

(57) ABSTRACT

A substrate treatment apparatus, which treats a substrate with a treatment liquid that is ultrasonically vibrated, includes an oscillator body which is rectangular-parallelepiped and has a treatment liquid supply path having an opening on a lower surface thereof in a first end portion in a longitudinal direction thereof and inclining to a second end portion in the longitudinal direction thereof, a vibrator which is provided on an upper surface of the oscillator body and ultrasonically vibrates the oscillator, and a heat exchanger which cools the treatment liquid supplied to the treatment liquid supply path.

7 Claims, 3 Drawing Sheets

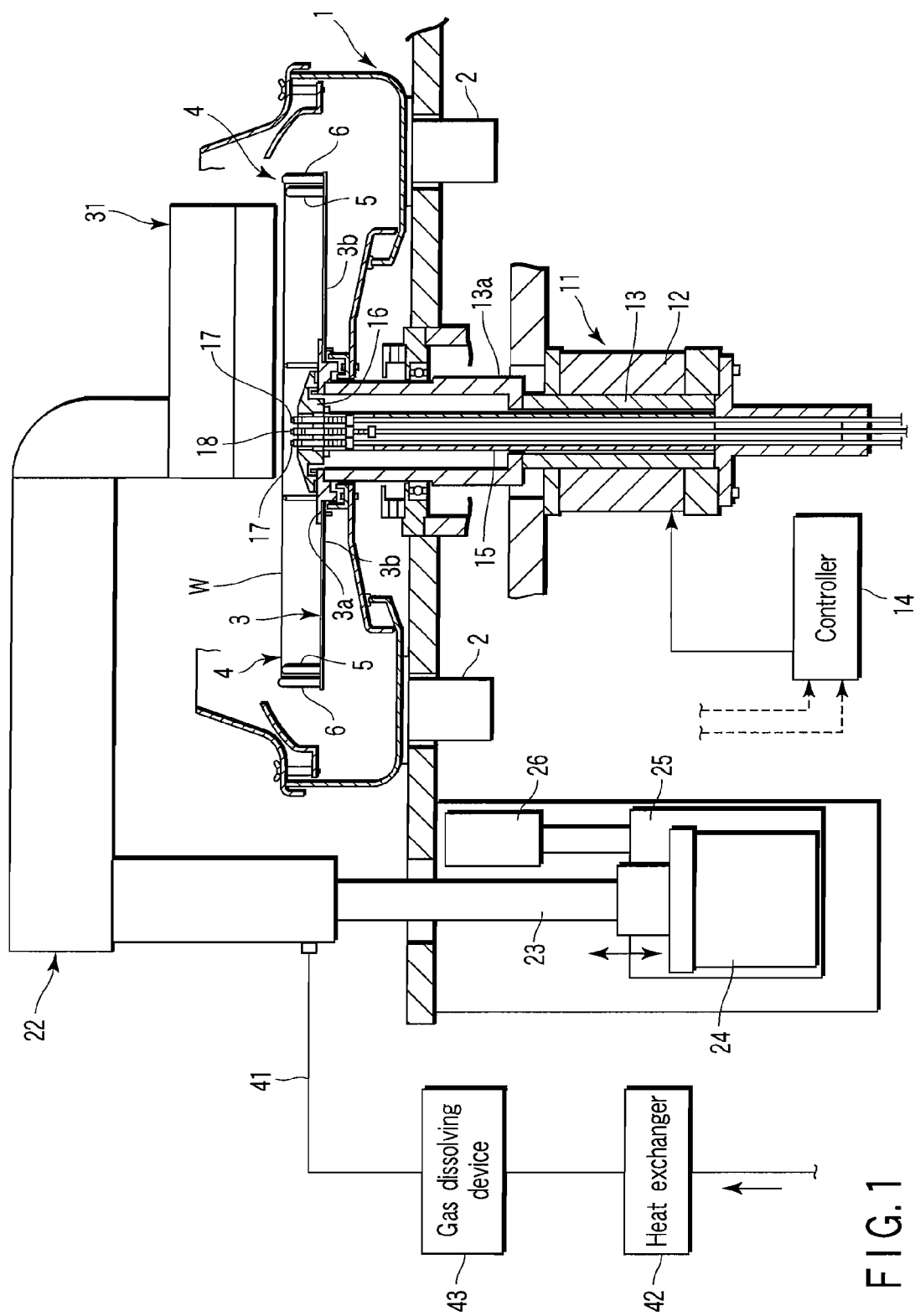
F I G. 1

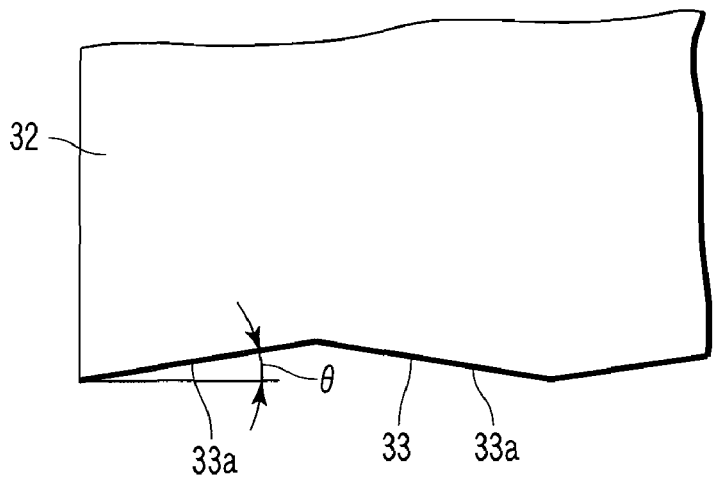
F I G. 4
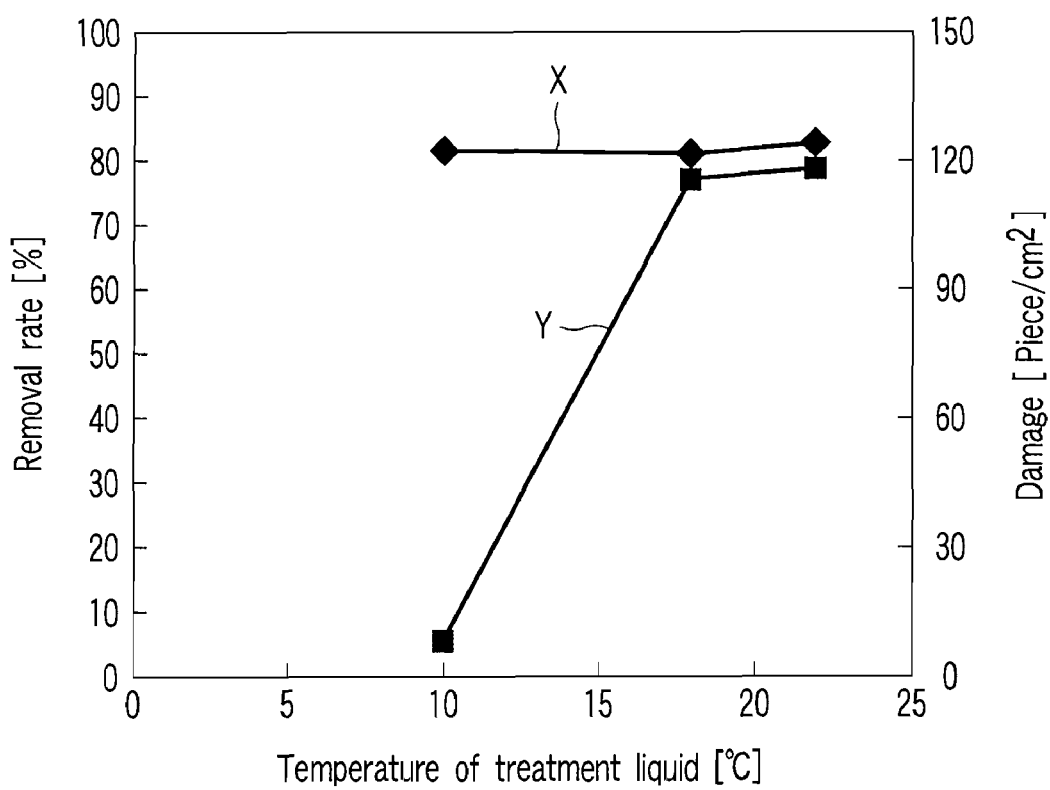
F I G. 5

SUBSTRATE TREATMENT APPARATUS

CROSS REFERENCE TO RELATED APPLICATIONS

This is a Continuation Application of PCT Application No. PCT/JP2006/323996, filed Nov. 30, 2006, which was published under PCT Article 21(2) in Japanese.

This application is based upon and claims the benefit of priority from prior Japanese Patent Application No. 2005-345580, filed Nov. 30, 2005, the entire contents of which are incorporated herein by reference.

BACKGROUND OF THE INVENTION

1. Field of the Invention

The present invention relates to a substrate treatment apparatus to treat a substrate with a treatment liquid, to which ultrasonic waves are applied.

2. Description of the Related Art

Processes for manufacturing a semiconductor device or liquid crystal display device include a lithography process to form a circuit pattern on a substrate, such as a semiconductor wafer or a glass substrate. The lithography process, as well known, includes a series of steps of applying a resist to the substrate, irradiating the resist with light via a mask on which a circuit pattern is formed, removing a part of the resist which is not irradiated with light (or a part of the resist which is irradiated with light), and etching a part from which the resist is removed. The above steps are repeated a plurality of times, so that a circuit pattern is formed on the substrate.

In the series of steps described above, if the substrate is soiled, the circuit pattern cannot be precisely formed, resulting in production of a defective item. Therefore, when forming a circuit pattern in each step, the substrate is treated with a treatment liquid to bring the substrate to a clean state in which no resist or minute particles, such as dust, may remain.

A spinning apparatus is known as the abovementioned apparatus that treats a substrate with a treatment liquid. The spinning apparatus has a cup body. A turntable is provided in the cup body. The substrate is removably held on the turntable.

A nozzle body is disposed above the turntable. A treatment liquid is supplied to the substrate from the nozzle body while the turntable is rotating, thereby treating the substrate.

There is a possibility that soil adhering to a substrate cannot be fully removed simply by supplying a treatment liquid to the substrate. Therefore, ultrasonic vibrations are applied to the treatment liquid to be supplied to the substrate, so that the cleaning efficiency can be improved.

Conventionally, the nozzle body is used to supply an ultrasonically vibrated treatment liquid to a substrate. The nozzle body has a supply port and a spray port for the liquid, and contains a vibration plate. The treatment liquid is supplied to the nozzle body through the supply port, brought into contact with the vibration plate which is ultrasonically vibrated, accelerated at the spray port which has a small opening area, and sprayed on the substrate.

The treatment liquid sprayed on the substrate is repeatedly pressurized and depressurized by ultrasonic vibrations. In the depressurizing time, a void is formed around gas as a core, which has been dissolved in the liquid. In the pressurizing time, the void collapses, resulting in generation of a shock wave, which is called cavitation. As a result, the soil is removed from the substrate.

It is known that the cavitation, which results from application of ultrasonic vibrations to the treatment liquid, is more significant as the temperature of the treatment liquid is higher. However, if the cavitation in the treatment liquid is significant, fine wirings formed on the substrate may be damaged by the cavitation. Therefore, when ultrasonic vibrations are to be applied to the treatment liquid, it is required to control the temperature of the treatment liquid.

Besides, the conventional nozzle body has a structure in which the treatment liquid is brought into contact with the vibration plate provided inside the nozzle body, so that ultrasonic vibrations are generated, as described above. The vibration plate, which is ultrasonically vibrated is heated by the energy applied to the vibration plate to a high temperature. Therefore, the temperature of the treatment liquid, which is brought into contact with the vibration plate, inevitably increases.

Accordingly, when the substrate is treated with the ultrasonically vibrated treatment liquid, the substrate may be damaged.

Moreover, the treatment liquid sprayed from the spray port of the nozzle body on the substrate is accelerated. The accelerated treatment liquid applies shock to the substrate, which may also damage the substrate.

BRIEF SUMMARY OF THE INVENTION

The present invention is to provide a substrate treatment apparatus, which assuredly controls the temperature of an ultrasonically vibrated treatment liquid, when it cleans a substrate with the treatment liquid, so that the substrate can be cleaned without damage.

According to the present invention, there is provided a substrate treatment apparatus, which treats a substrate with a treatment liquid that is ultrasonically vibrated, the apparatus comprising:

an oscillator body which is rectangular-parallelepiped and has a treatment liquid supply path having an opening on a lower surface thereof in a first end portion in a longitudinal direction thereof and inclining to a second end portion in the longitudinal direction thereof;

a vibrator which is provided on an upper surface of the oscillator body and ultrasonically vibrates the oscillator body; and first cooling means for cooling the treatment liquid supplied to the treatment liquid supply path.

BRIEF DESCRIPTION OF THE SEVERAL VIEWS OF THE DRAWING

FIG. 1 is a schematic view showing a spinning apparatus as a treatment apparatus according to an embodiment of the present invention.

FIG. 4 is an enlarged cross-sectional view of a lower end portion of the oscillator body.

FIG. 5 is a graph showing the relationship of measurements of the temperature of the treatment liquid, the removal rate of particles and damage.

DETAILED DESCRIPTION OF THE INVENTION

Figure 2:
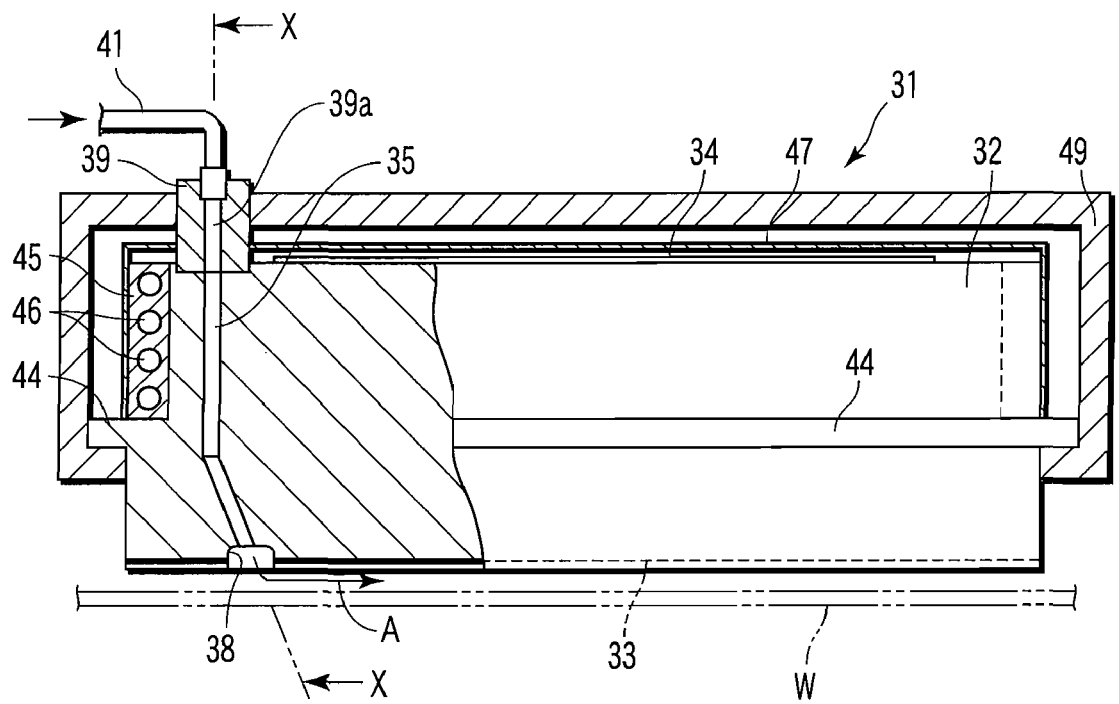
FIG. 2 is a cross-sectional view of an oscillator body provided to an arm of the spinning apparatus, taken along the longitudinal direction of the oscillator body.

An embodiment of the present invention will now be described with reference to the drawings.

FIG. 1 shows a spinning apparatus as a treatment apparatus according to an embodiment of the present invention. The spinning apparatus has a cup body 1. A plurality of discharge pipes 2 are connected to a bottom portion of the cup body 1 at regular intervals in the circumferential direction. Each of the discharge pipes communicates with a discharge pump, which is not shown.

A turntable 3 is disposed in the cup body 1. The turntable 3 has a base portion 3a, and four arm portions 3b (only two of which are shown). One end of each of the arm portions is provided with a support portion 4. The support portion 4 is comprised of a support pin 5, and a pair of engaging pins 6 (only one of which is shown), which is located nearer to the distal end of the arm 3b than the support pin 5. The engaging pins 6 are taller than the support pin 5.

A substrate W made of glass, which forms a liquid crystal display device, is placed on the turntable 3. The support pin 5 supports a lower surface of a corner portion in a periphery of the substrate W placed on the turntable 3, and the engaging pins 6 are engaged with and support a pair of sides of the corner portion.

The turntable 3 is rotated by a control motor 11. The control motor is comprised of a cylindrical stator 12, and a cylindrical rotor 13 rotatably inserted in the stator. The base portion 3a of the turntable 3 is connected to the rotor 13 through a power transmitting member 13a.

Rotation of the control motor 11 is controlled by a controller 14. As a result, the turntable 3 can be rotated at a predetermined number of revolutions by the controller 14.

A hollow fixed shaft 15 is inserted through the rotor 13. The fixed shaft 15 has at its upper end a nozzle head 16, which is located above the turntable 3. In other words, the nozzle head 16 does not rotate along with the turntable 3. The nozzle head 16 has a plurality of first nozzles 17, which eject a treatment liquid, and a second nozzle 18, which ejects gas.

With the above structure, the treatment liquid or gas can be selectively ejected toward a central portion of the lower surface of the substrate W held on the turntable 3 through the nozzles 17 and 18. Thus, the lower surface of the substrate W can be subjected to cleaning and drying processes.

An arm 22 is provided beside the cup body 1. The distal end of the arm 22 is connected to the upper end of a hollow shaft 23. The lower end of the shaft 23 is connected to a rotary motor 24. The rotary motor 24 rotates the shaft 23 by a specified angle. As a result, the arm 22 is rotatable about the shaft 23 above the turntable 3 across a diameter.

The rotary motor 24 is attached to a movable plate 25, which is movable upward and downward by a linear guide (not shown). The movable plate 25 is movable upward and downward by an up-and-down driving cylinder 26.

Figure 3:
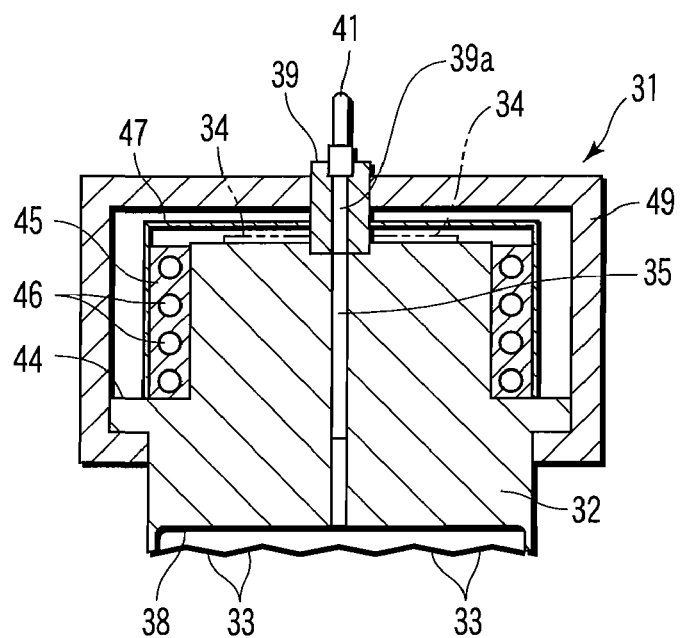
FIG. 3 is a cross-sectional view taken along the line X-X in FIG. 2.

A supply device 31 is provided at the distal end of the arm 22 to supply a treatment liquid, such as pure water, ozone water, a hydrogen peroxide solution or ammonia water, toward the substrate W held by the turntable 3. The supply device 31 has a rectangular-parallelepiped oscillator body 32 as shown in FIGS. 2 and 3, which is made of chemical-resistant and heat-resistant material, such as quartz. A plurality of guide grooves 33, whose cross sections are shaped like a triangular waveform, are formed in the lower surface portion of the oscillator body 32 along the entire length of the oscillator body, and arranged in parallel in the width direction thereof. As shown in FIG. 4, an angle θ of an inclined surface 33a forming the guide groove 33 is set to about 7-10 degrees.

Two strip-shaped vibrators 34, extending in the longitudinal direction of the oscillator body 32 and spaced in the width direction, are fixed to the upper surface thereof. A high frequency voltage is applied to the vibrators 34 by an ultrasonic oscillating device (not shown). As a result, the oscillator body 32 ultrasonically vibrates along with the vibrators 34.

If the angle θ of the inclined surface 33a is set to 7-10 degrees, when the ultrasonic vibrations of the vibrators 34 on the upper surface of the oscillator body 32 are transmitted to the lower surface of the oscillator body 32, they neither reflect on the inclined surfaces 33a of the lower surface nor return, but transmit therethrough.

A treatment liquid supply path 35, having an opening at one end, i.e., its upper end, is formed in one end portion of the longitudinal direction of the oscillator body 32. The other end portion of the supply path 35 is inclined from one end to the other end in the longitudinal direction of the oscillator body 32. The other end of the supply path 35 communicates with a diffusion groove 38, which extends over substantially the entire length in the width direction of the oscillator body 32 in the lower surface of the one end portion of the oscillator body 32. In other words, the other end of the supply path 35 opens at the lower surface of the one end portion in the longitudinal direction of the oscillator body 32 via the diffusion groove 38.

A connection block 39 is mounted on the upper surface of the one end portion of the oscillator body 32 such that the lower end of the connection block 39 is in liquid-tight contact with the upper surface of block 32. A communication path 39a is formed in the connection block 39. One end of the communication path 39a communicates with the one end of the supply path 35.

The other end of the communication path 39a is connected to one end of a supply pipe 41, which supplies the treatment liquid as shown in FIG. 1. The supply pipe 41 passes through the arm 22 and extends outside of arm 22, and the other end thereof is connected to a treatment liquid supply source (not shown).

As shown in FIG. 1, a heat exchanger 42, as first cooling means to cool the treatment liquid, and a gas dissolving device 43 to dissolve nitrogen gas, air or carbon dioxide gas in the treatment liquid, are connected in sequence to the portion of the supply pipe 41 that is outside of arm 22.

The heat exchanger 42 is configured to cool the treatment liquid to a desired temperature. In this embodiment, it can cool the treatment liquid to a temperature lower than the room temperature of the clean room where the treatment apparatus is located, in a range of, for example, from 10° C. to 20° C.

A flange 44 is formed around the overall circumferential surface of the oscillator body 32 in a middle portion in the height direction. A cooling body 45, as second cooling means, is provided on a portion of the side surface of the oscillator body 32, above the flange 44. The cooling body 45 has a flow path 46, which allows passage of a cooling medium, such as cooling water.

The oscillator body 32 and the vibrators 34 provided on the upper surface of the oscillator body 32 are cooled by the cooling medium passing through the flow path 46. The cooling body 45 may be provided on the upper surface, not the side surface, of the oscillator body 32. It may be provided on at least one of the side or upper surface of the oscillator body 32.

The portion of the oscillator body 32, above the flange 44, is covered with an inner cover 47. The inner cover 47 is covered with an outer cover 49, both ends of which are liquid-tightly put over the lower surface of the flange 44 via packing (not shown). Therefore, even if the treatment liquid, such as a sulfuric acid solution or a hydrogen peroxide solution, supplied to the substrate W is scattered in the cup body 1, the treatment liquid or atmosphere thereof is prevented from adhering to the vibrators 34 or the like.

A case of removing soil, such as particles adhering to the substrate W by means of the above pinning apparatus, will now be described.

First, the cooling medium is caused to flow through the flow path 46 of the cooling body 45, while the arm 22 is moved downward so that the lower surface of the oscillator body 32 faces the central portion of the upper surface of the substrate W held on the turntable 3 with a small gap therebetween. At this time, the oscillator body 32 is positioned relative to the radial direction of the substrate W such that the top end of the supply path 35, which opens downward, substantially coincides with the center of rotation of the substrate W.

Then, a high-frequency voltage is applied to the vibrators 34, thereby ultrasonically vibrating the oscillator body 32, and the treatment liquid is supplied through the supply pipe 41 connected to the oscillator body 32. At the same time, the arm 22 is rotated, so that the supply device 31 reciprocates between the center of rotation and the outer end in the radial direction of the substrate W.

The treatment liquid flows from the supply pipe 41 through the supply path 35 formed in the oscillator body 32, and diffuses in the diffusion groove 38 on the lower surface of the oscillator body 32 over the entire length in the width direction of the oscillator body 32. Then, it flows out to the gap between the lower surface of the oscillator body 32 and the upper surface of the substrate W. Since the treatment liquid diffuses in the diffusion groove 38, it flows on the substrate W without increasing its flow rate as compared to the flow rate in the supply path 35.

The lower end portion of the supply path 35 is inclined from one end to the other end of the oscillator body 32 in the longitudinal direction of the oscillator body 32. Therefore, the treatment liquid, flowing to the gap between the lower surface of the oscillator body 32 and the upper surface of the substrate W, flows out from the diffusion groove 38 of the oscillator body 32 along the direction of inclination of the supply path 35 to the lower surface of the oscillator body 32 as indicated by an arrow A in FIG. 2. Then, it is guided by the guide grooves 33 and flows to the upper surface of the substrate W.

The oscillator body 32 applies ultrasonic vibrations to the treatment liquid flowing through the guide grooves 33. Therefore, the upper surface of the substrate W is treated with the treatment liquid being ultrasonically vibrated. After washing the upper surface of the substrate W, the treatment liquid smoothly flows in the predetermine direction along the guide grooves, and flows out and away from the upper surface of the substrate W.

Therefore, the soil removed from the substrate W by the ultrasonically vibrated treatment liquid, quickly and smoothly flows away from the upper surface of the substrate W together with the treatment liquid. Therefore, it is prevented from adhering again to the upper surface of the substrate W.

The treatment liquid supplied to the oscillator body 32 is cooled by the heat exchanger 42 provided in the supply pipe 41 to a desired temperature, for example, a temperature lower than the room temperature of the clean room where the apparatus is located, for example, 10° C. to 20° C. In addition, the oscillator body 32 is cooled by the cooling medium flowing through the cooling body 45 provided on the circumferential surface thereof.

Therefore, even if the vibrators 34 are heated by the voltage applied thereto to generate ultrasonic vibrations, the oscillator body 32 and the treatment liquid flowing through the supply path 35 formed in the oscillator body 32 are prevented from being heated and increasing in temperature.

Thus, when the oscillator body 32 applies ultrasonic vibrations to the treatment liquid flowing through the supply path 35 and the substrate W is cleaned by the cavitation of the treatment liquid, the treatment liquid cleaning the substrate W is kept at a temperature set by the heat exchanger 42. Consequently, the substrate W is prevented from damage due to increase in temperature of the treatment liquid.

FIG. 5 is a graph, in which the relationship between a temperature of the treatment liquid and a removal rate of particles of the cleaned substrate is indicated by a first line X, and the relationship between a temperature of the treatment liquid and damage incurred by the substrate is indicated by a second line Y. In the graph, the horizontal axis represents the temperature of the treatment liquid. One vertical axis represents the removal rate of particles, and the other vertical axis represents the damage incurred by the substrate. The damage is expressed by the number of defects, such as cut or toppling of wires, per 1 cm$^2$.

As clear from FIG. 5, the removal rate of particles is substantially constant, and is not influenced by the temperature of the treatment liquid. In contrast, the damage incurred by the substrate W is slightly less in the case where the temperature of the treatment liquid is 18° C., as compared to the case of 22° C., and that is significantly reduced in the case of 10° C. as compared to the case of 18° C.

Thus, it is verified that the lower the temperature of the treatment liquid, the smaller the damage incurred by the substrate w. It is also verified that when ultrasonic vibrations are applied to the treatment liquid cooled to a temperature of about 10° C. and the substrate W is cleaned by the treatment liquid, the substrate W can be cleaned with substantially no damage.

Based on the above, it is particularly preferable that the temperature of the treatment liquid be set to a range of 10-18° C. However, even when the temperature is 18-20° C., the damage incurred by the substrate W is reduced to some degree. Therefore, the temperature of the treatment liquid may be set to a range of 10-20° C.

When the temperature of the treatment liquid is 10° C., the number of damages incurred by the substrate W is substantially 0. Therefore, if the treatment liquid is set to a lower temperature, the number of damages incurred by the substrate W will not substantially change.

When the treatment liquid is supplied to the substrate W, it is diffused from the supply path 35 to the diffusion groove 38 and then supplied to the substrate W; therefore, the flow rate thereof does not increase as compared to that in the supply path 35. Thus, the substrate W does not receive shock due to an increase in flow rate of the treatment liquid. This also prevents the substrate W from being damaged.

The gas dissolving device 43 is provided in the supply pipe 41, which supplies the treatment liquid. Therefore, the amount of gas dissolved in the treatment liquid can be adjusted by the gas dissolving device 43. If the amount of gas contained in the treatment liquid is controlled, the intensity of the cavitation that occurs when ultrasonic vibrations are applied to the treatment liquid can be adjusted. Therefore, if the amount of gas contained in the treatment liquid is controlled, as well as the temperature of the treatment liquid, the cleaning performance by the treatment liquid can be much improved.

The area of the substrate W, which is the same as that of the lower surface of the oscillator body 32, is cleaned in unit time. More specifically, since the ultrasonically vibrated treatment liquid exists between the overall lower surface of the oscillator body 32 and the corresponding part of the substrate W opposing to the overall lower surface, the treatment by the treatment liquid can be carried out in the area corresponding to the lower surface of the oscillator body 32. Thus, since the area treated in the unit time is increased as compared to the conventional apparatus using the nozzle body, the substrate W can be cleaned efficiently.

Moreover, the oscillator body 32 is attached to the arm 22, which rotates the oscillator body 32 above the upper surface of the substrate W across a diameter thereof. This can also increase the efficiency of cleaning the substrate W.

According to the present invention, the treatment liquid cooled by the first cooling means flows through the supply path provided in one end portion of the oscillator body in the longitudinal direction. Then, it is ultrasonically vibrated without being brought into contact with the vibrators which ultrasonically vibrate the oscillator body, and flows out from the supply path. Therefore, the treatment liquid can be ultrasonically vibrated and supplied to the substrate without increasing its temperature.

What is claimed is:

1. A substrate treatment apparatus, which treats a substrate with a treatment liquid that is ultrasonically vibrated, the apparatus comprising:
   an oscillator body which is rectangular-parallelepiped and has a plurality of guide grooves formed in a lower surface of the oscillator body and extending over an entire length in a longitudinal direction of the oscillator body and arranged substantially in parallel fashion with one another in a width direction of the oscillator body, a treatment liquid supply path extending through the oscillator body and having an opening on a lower surface thereof in a first end portion in the longitudinal direction thereof and inclining to a second end portion in the longitudinal direction thereof, and a diffusion groove formed in the lower surface of the oscillation body at one end portion thereof in the longitudinal direction, communicating with the treatment liquid supply path and extending over an entire length in the width direction of the oscillator body;
   a vibrator which is provided on an upper surface of the oscillator body and ultrasonically vibrates the oscillator body; and
   a cooling component for cooling the treatment liquid supplied to the treatment liquid supply path.

2. The substrate treatment apparatus according to claim 1, wherein the oscillator body includes a cooling body for cooling the oscillator body.

3. The substrate treatment apparatus according to claim 1, wherein the diffusion groove is configured so that the treatment liquid supplied by the treatment liquid supply path is not accelerated as it is supplied to the substrate.

4. The substrate treatment apparatus according to claim 1, wherein the cooling component cools the treatment liquid to 10-18° C.

5. The substrate treatment apparatus according to claim 1, further comprising a gas dissolving device, provided in the treatment liquid supply path, for dissolving gas in the treatment liquid.

6. The substrate treatment apparatus according to claim 1, further comprising:
   a turntable, which is rotatable and holds the substrate; and
   an arm body, which is rotated above the turntable, wherein the oscillator body is mounted at a distal end portion of the arm body such that the lower surface thereof faces the substrate.

7. The substrate treatment apparatus according to claim 1, wherein the cooling component is a heat exchanger.

* * * * *